(12) United States Patent
Lee

(10) Patent No.: US 7,186,646 B2
(45) Date of Patent: Mar. 6, 2007

(54) SEMICONDUCTOR DEVICES AND METHODS OF FORMING A BARRIER METAL IN SEMICONDUCTOR DEVICES

(75) Inventor: Han-Choon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 241 days.

(21) Appl. No.: 10/925,777

(22) Filed: Aug. 25, 2004

(65) Prior Publication Data

US 2005/0062159 A1 Mar. 24, 2005

(30) Foreign Application Priority Data

Sep. 19, 2003 (KR) ............ 10-2003-0065172

(51) Int. Cl.
*H01L 21/44* (2006.01)

(52) U.S. Cl. ............ 438/653; 438/656; 438/675; 257/E21.584

(58) Field of Classification Search ............... None
See application file for complete search history.

(56) References Cited

U.S. PATENT DOCUMENTS

| 6,376,371 | B1 | 4/2002 | Jain et al. | |
| 6,436,825 | B1 | 8/2002 | Shue | |
| 2002/0005582 | A1* | 1/2002 | Nogami et al. | ............ 257/758 |
| 2004/0009336 | A1* | 1/2004 | Marcadal et al. | ........... 428/210 |

* cited by examiner

*Primary Examiner*—David E. Graybill
(74) *Attorney, Agent, or Firm*—Andrew D. Fortney

(57) ABSTRACT

Semiconductor devices and methods of forming a barrier metal in semiconductor devices are disclosed. A disclosed semiconductor device includes a metal layer on a semiconductor substrate; an interlayer dielectric layer on the metal layer, a hole in the interlayer dielectric layer that exposes a portion of the metal layer; and a barrier metal on inner walls of the hole. The barrier metal is made of TaSiN having a resistivity less than or equal to about 10,000 μohm-cm.

13 Claims, 2 Drawing Sheets

SEMICONDUCTOR DEVICES AND METHODS OF FORMING A BARRIER METAL IN SEMICONDUCTOR DEVICES

FIELD OF THE DISCLOSURE

The present disclosure relates generally to semiconductor fabrication and, more particularly, to semiconductor devices and methods of forming a barrier metal in semiconductor devices.

BACKGROUND

In a conventional semiconductor device, a barrier metal is often deposited on the inner walls of holes such as contact holes or via holes. A metal material is then formed on the barrier metal to thereby fill the holes. TaSiN is considered to be the best material for use as the barrier metal, but a drawback of TaSiN is that its resistivity is too high.

The TaSiN barrier is typically formed by PVD (physical vapor deposition) or CVD (chemical vapor deposition). In PVD, a TaSi target is reacted with nitrogen while undergoing physical vaporization to thereby realize the deposition of TaSiN. The advantage of PVD is that manufacture is made easy. However, when TaSiN is used as a barrier metal for copper metal lines, $Cu_3Si$ is formed on the interfacial surfaces of the TaSiN and Cu because copper is easily diffused while in a polycrystalline state. Further, with the use of PVD, it is difficult to obtain a step coverage of a desired level in a device requiring a high aspect ratio.

As a result of the problems associated with PVD, more resources are being directed toward research into using CVD to form TaSiN. U.S. Pat. Nos. 6,376,371 and 6,436,825 are examples of conventional CVD methods for forming TaSiN.

However, because of various organic residual materials present in a precursor used in CVD, the deposited TaSiN has a high resistivity. When TaSiN having a high resistivity is used as a barrier metal for copper metal lines, the overall resistance of the device is increased. This results in deterioration of metal line reliability.

DETAILED DESCRIPTION

Figure 1A:
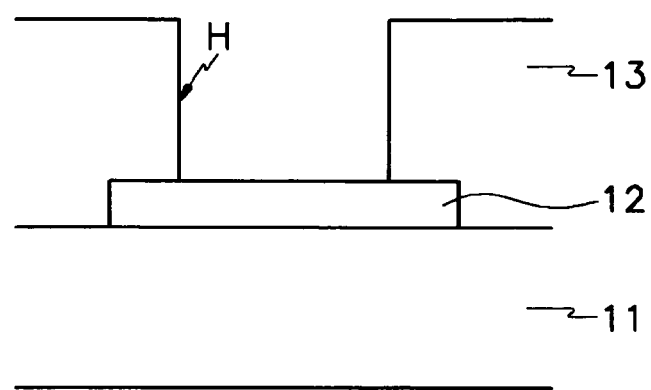
FIGS. 1a–1d are cross-sectional views illustrating an example method preformed in accordance with the teachings of the invention to form a barrier metal in a semiconductor device.
Figure 1B:
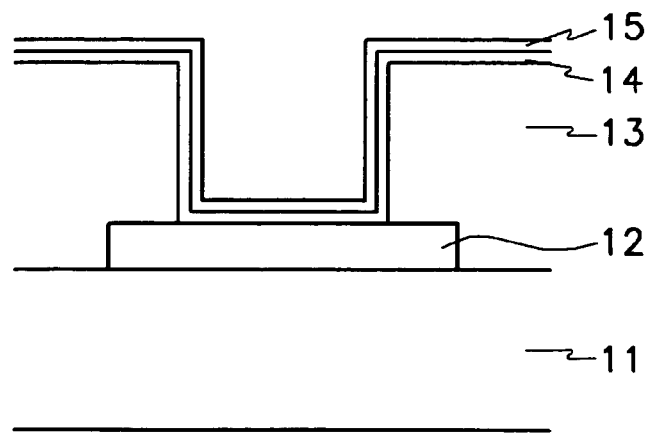
Figure 1C:
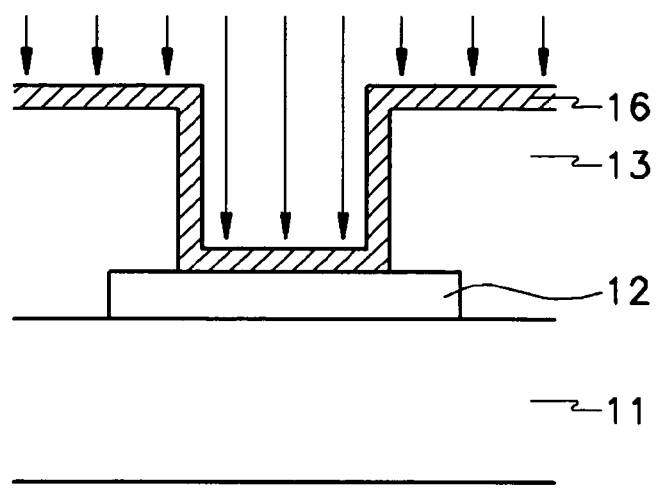
Figure 1D:
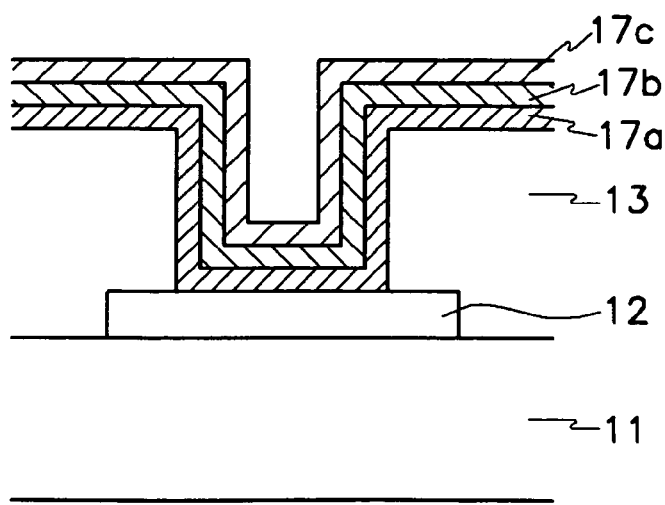

FIG. 1d is a cross-sectional view of an example semiconductor device constructed in accordance with the teachings of the present invention. In the illustrated example, a metal layer 12 of a predetermined thickness is formed on a structure 11 of a semiconductor substrate on which there is formed an individual device. An interlayer dielectric layer 13 is formed on the metal layer 12. A hole that exposes part of the metal layer 12 is formed in the interlayer dielectric layer 13.

A barrier metal 17a having a resistivity equal to or less than 10,000 μohm-cm and that is realized through TaSiN is formed on inner walls of the hole. The barrier metal 17a is formed by reaction between a Si source layer, a Ta layer, and nitrogen. In an example, the Si source layer and the Ta layer are formed by ALD (atomic layer deposition). Further, the Si source layer may be an $SiH_4$ layer or an Si layer.

The barrier metal 17a may have a thickness that is less than 100 Å. Also, the barrier metal 17a may be formed by stacking two or more layers on top of each other, with each layer having a thickness of less than 100 Å.

In the example shown in FIG. 1d, the barrier metal is formed by stacking three layers 17a, 17b, and 17c on top of each other. In an example, a volume of the barrier metal 17a is reduced by reacting impurities contained therein with gas that includes hydrogen.

An example method of forming a barrier metal having the above structure will now be described with reference to the drawings. In particular, FIGS. 1a–1d are cross-sectional views showing sequential states in that method.

Referring to FIG. 1a, a metal layer 12 is formed on a semiconductor substrate 11. The metal layer 12 is selectively etched so that it remains covering a predetermined area of the substrate 11 and so that it is formed to a predetermined thickness.

Next, an interlayer dielectric layer 13 is thickly formed over the entire surface of the semiconductor substrate 11 and the metal layer 12 such that the metal layer 12 is covered. The interlayer dielectric layer 13 is selectively etched to form a contact hole H of predetermined dimensions to expose a predetermined area of the metal layer 12.

Referring to FIG. 1b, an Si source layer 14 is thinly formed to between a few and a few tens of angstroms on all exposed elements. That is, the Si source layer 14 is formed on the interlayer dielectric layer 13, along the side walls of the interlayer dielectric layer 13 within the contact hole H, and on the predetermined area of the metal layer 12 exposed by the hole H. In the illustrated example, the Si source layer 14 is formed by ALD.

The Si source layer 14 refers to a layer that includes Si, which has a high level of reactivity. A method of utilizing $SiH_4$ gas may be applied to form the Si source layer 14, but persons of ordinary skill in the art will appreciate that other approaches are also appropriate. In the method utilizing $SiH_4$ gas, a wafer is placed in a chamber, and $SiH_4$ gas is injected into the chamber in a state where the wafer is heated to about 170–550° C. Also, the inside of the chamber is set to a pressure of about 90–300 torr. The chamber is maintained in this state for about 10–120 seconds to thereby result in the formation of a thin $SiH_4$ or Si layer on all exposed elements.

After utilizing the $SiH_4$ gas to form the Si source layer 14, a reaction gas that includes Ta is injected into the chamber while maintaining the wafer at a temperature of about 170–550° C. Therefore, a Ta layer 15 is formed to a thickness of a few to a few tens of angstroms on the Si source layer 14. A gas containing nitrogen is also injected into the chamber during this process.

TBTDET [tertbutylimido (trisdiethylamide) tantalum], PDEAT [pentakis (diethylamide) tantalum], PDMAT [pentakis (dimethylamide) tantalum], or PEMAT [pentakis (ethylmethylamino) tantalum] may be used for reaction gas containing Ta. Further, $NH_3$ gas or $N_2$ gas may be used as the gas containing nitrogen for injection into the chamber during formation of the Ta layer 15.

Next, referring to FIG. 1c, the Ta layer 15 and the Si of the Si source layer 14 react to form a TaSi layer. At the same time, the nitrogen (N) from the injected $NH_3$ gas or $N_2$ gas reacts with the TaSi layer thereby resulting in the formation of a TaSiN layer 16. Since each of the Si source layer 14 and the Ta layer 15 is formed to a thickness of a few to a few tens of angstroms as described above, the TaSiN layer 16 resulting from the reaction of these two layers is also formed to a thickness of less than 100 Å.

A problem, however, with the TaSiN layer 16 formed in this manner is the large levels of impurities such as O and C impurities, as well as organic matter present in the TaSiN layer 16. The presence of these impurities results in the TaSiN layer 16 having a high resistivity. It is therefore necessary to remove the impurities and organic matter.

To accomplish this removal, a gas containing nitrogen such as $NH_3$ gas or $H_2$ gas is injected into the chamber at a flow rate of about 100–400 sccm. This gas injection is done while the wafer is maintained at a temperature of about 170–550° C. Therefore, the hydrogen (H) of the $NH_3$ gas or $H_2$ gas reacts with O- or C-group to respectively produce an $H_2O$ or $CH_x$ compound. Impurities and organic matters are removed from the TaSiN layer 16 through this process.

By removing impurities as described above, the TaSiN layer 16 becomes more flawlessly formed, and may also undergo a reduction in volume. Ultimately, with reference to FIG. 1d, this results in the formation of the TaSiN layer 17a to between a few and a few tens of angstroms and having a low resistivity.

In order to form a TaSiN layer of a low resistance to a desired thickness, the above processes may be repeated. That is, the processes are repeated starting with the formation of an Si source layer to result in the formation of a second TaSiN layer 17b. A third TaSiN layer 17c may also be formed in the same manner. The desired thickness may be obtained by repeating this process by as many as a few hundred times.

In the process described above, the Si source layer 14 and the Ta layer 15 are thinly formed to between about a few and a few tens of angstroms. During the layer formation process, gas containing nitrogen is injected into the processing chamber so that nitrogen reacts with the Si source layer 14 and the Ta layer 15 to thereby form a TaSiN layer of a thickness of about a few to a few tens of angstroms. The TaSiN layer formed in this manner is then reacted with $NH_3$ gas or $H_2$ gas to remove impurities in the TaSiN layer. This results in the formation of a TaSiN barrier metal having a low resistivity.

Further, a desired thickness of the TaSiN layer is obtained by repeating the ALD process from between a few times and a few hundred times. Therefore, a TaSiN layer is formed having excellent step coverage with respect to a hole H with a high aspect ratio and a width that is on the scale of nanometers.

Since the TaSiN layer formed according to the process described above is deposited in an amorphous state, in addition to being formed to a minimal thickness, it performs well in preventing diffusion (i.e., in decreasing the diffusion of copper metal).

In addition, the ALD process utilizes existing CVD chambers without having to modify the same. Therefore, the above described method may be employed without requiring investment in new equipment.

From the foregoing, persons of ordinary skill in the art will appreciate that semiconductor devices and methods for manufacturing semiconductor devices have been disclosed in which TaSiN, which functions well to prevent diffusion and has a low resistivity, is deposited as a barrier metal on inner walls of holes. In addition, the TaSiN barrier metal provides for excellent step coverage. In the example described above, atomic layer deposition (ALD) is used to form the TaSiN layer.

An example semiconductor device includes a metal layer 12 formed on a semiconductor substrate 11. An interlayer dielectric layer 13 is formed on the metal layer. A hole H that exposes part of the metal layer 12 is formed in the interlayer dielectric 13. A barrier metal is formed on the inner walls of the hole H. The barrier metal is made of TaSiN having a resistivity that is less than or 10,000 μohm-cm.

The barrier metal is formed by a reaction between an Si source layer 14, a Ta layer 15, and nitrogen. The Si source layer 14 and the Ta layer 15 are formed using atomic layer deposition.

In the illustrated example, the Si source layer 14 is an $SiH_4$ layer or an Si layer.

Further, the barrier metal has a thickness of less than about 100 Å, or is formed by stacking two layers, each having a thickness of less than about 100 Å.

In an example, a volume of the barrier metal is reduced by the reaction between impurities contained in the barrier metal and hydrogen.

A disclosed method of forming a barrier metal in a semiconductor device includes forming an interlayer dielectric layer 13 on a metal layer 12 formed on a semiconductor substrate 11, and then selectively etching the interlayer dielectric layer 13 to form a hole H that exposes a predetermined area of the metal layer 12. An Si source layer 14 is formed on inner walls of the hole H. Further, a Ta layer 15 is formed on the Si source layer 14, and, at the same time, a gas containing nitrogen is injected on the Ta layer 15 to thereby react the Si source layer 14, the Ta layer 15, and nitrogen to form a TaSiN layer.

The method further includes removing impurities in the TaSiN layer by injecting gas containing hydrogen on the formed TaSiN layer such that the impurities contained in the TaSiN layer are reacted with the hydrogen.

The Si source layer 14 and the Ta layer 15 are formed to a thickness of about a few to a few tens of angstroms by atomic layer deposition.

An $SiH_4$ layer or an Si layer may be used as the Si source layer 14. In an example, the Si source layer 14 is formed by placing the substrate 11 in a chamber and raising a temperature of the substrate to about 170–550°C., and injecting an $SiH_4$ gas into the chamber to thereby form an $SiH_4$ layer or an Si layer.

In another example, the Si source layer 14 is formed by obtaining a pressure in a chamber of about 90–300 torr and maintaining this pressure for about 10–120 seconds to thereby form an $SiH_4$ layer or an Si layer.

The Ta layer 15 of the illustrated example is formed by setting a temperature of the Ta layer 15 to about 170–550° C., and injecting a reaction gas containing Ta into the chamber containing the structure. The reaction gas containing Ta is one of TBTDET [tertbutylimido (trisdiethylamide) tantalum], PDEAT [pentakis (diethylamide) tantalum], PDMAT [pentakis (dimethylamide) tantalum], and PEMAT [pentakis (ethylmethylamino) tantalum].

The gas containing nitrogen may be an $NH_3$ gas or an $N_2$ gas.

The impurities in the TaSiN layer are removed by setting a temperature of the substrate 11 to about 170–550° C., and injecting gas containing hydrogen such as $NH_3$ gas or $H_2$ gas into the chamber at a rate of about 100–400 sccm. The impurities in the TaSiN layer are removed by reaction with hydrogen. As a result, the volume of the TaSiN layer is reduced, the TaSiN layer is more precisely formed, and the thickness of the TaSiN layer is made to less than about 100 Å.

In some examples, the processes of forming an Si source layer 14 on inner walls of the hole H, and forming a Ta layer 15 on the Si source layer 14, and injecting a gas containing nitrogen on the Ta layer 15 to form a the TaSiN layer, are repeated a predetermined number of times to obtain a desired thickness of the TaSiN layer.

This patent claims priority from Korean Patent Application Serial No. 10-2003-0065172 which was filed on Sep. 19, 2003 and which is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of forming a barrier metal in a semiconductor device comprising:
    forming an interlayer dielectric layer on a metal layer disposed on a semiconductor substrate;
    selectively etching the interlayer dielectric layer to form a hole that exposes a portion of the metal layer;
    forming an Si source layer on inner walls of the hole; and
    forming a Ta layer on the Si source layer while injecting a gas containing nitrogen on the Ta layer to thereby react the Si source layer, the Ta layer, and nitrogen to form a TaSiN layer.

2. A method as defined in claim 1, further comprising removing impurities in the TaSiN layer by injecting gas containing hydrogen on the TaSiN layer such that the impurities contained in the TaSiN layer are reacted with the hydrogen.

3. A method as defined in claim 1, wherein the Si source layer and the Ta layer are formed by atomic layer deposition.

4. A method as defined in claim 1, wherein the Si source layer is one of an $SiH_4$ layer and an Si layer.

5. A method as defined in claim 1, wherein the Si source layer is formed by placing the substrate in a chamber, raising a temperature of the substrate to about 170–550° C., and injecting an $SiH_4$ gas into the chamber to thereby form one of an $SiH_4$ layer and an Si layer.

6. A method as defined in claim 1, wherein the Si source layer is formed by pressurizing a chamber to about 90–300 torr for about 10–120 seconds to form one of an $SiH_4$ layer and an Si layer.

7. A method as defined in claim 1, wherein forming the Ta layer comprises injecting a reaction gas containing Ta into a chamber while a temperature of the substrate is maintained at about 170–550° C.

8. A method as defined in claim 7, wherein the reaction gas containing Ta is one of TBTDET [tertbutylimido (trisdiethylamide) tantalum], PDEAT [pentakis (diethylamide) tantalum], PDMAT [pentakis (dimethylamide) tantalum], and PEMAT [pentakis (ethylmethylamino) tantalum].

9. A method as defined in claim 1, wherein the gas containing nitrogen is one of an $NH_3$ gas and an $N_2$ gas.

10. A method as defined in claim 2, wherein removing the impurities in the TaSiN layer comprises setting a temperature of the substrate to about 170–550° C., and injecting gas containing hydrogen into a chamber.

11. A method as defined in claim 2, wherein the gas containing hydrogen is one of an $NH_3$ gas and an $H_2$ gas, and the gas is supplied at a rate of about 100–400 sccm.

12. A method as defined in claim 2, wherein removing the impurities in the TaSiN layer results in a reduction in volume of the TaSiN layer so that the TaSiN layer has a thickness of less than about 100 Å.

13. A method as defined in claim 1, further comprising repeatedly forming an Si source layer; and forming a Ta layer on the Si source layer while injecting a gas containing nitrogen on the Ta layer to thereby react the Si source layer, the Ta layer, and nitrogen to form a TaSiN layer a predetermined number of times to form the TaSiN layer to a desired thickness.

* * * * *